United States Patent [19]

Lee et al.

[11] Patent Number: 4,884,238

[45] Date of Patent: Nov. 28, 1989

[54] READ-ONLY MEMORY

[75] Inventors: Kang W. Lee, Wayzata; Robert L. Rabe, Maple Grove, both of Minn.

[73] Assignee: Honeywell Inc., Minneapolis, Minn.

[21] Appl. No.: 165,852

[22] Filed: Mar. 9, 1988

[51] Int. Cl.[4] ............................................. G11C 17/06
[52] U.S. Cl. ..................................... 365/105; 365/175
[58] Field of Search ............... 365/175, 177, 174, 104, 365/105

[56] References Cited

U.S. PATENT DOCUMENTS

| | | | |
|---|---|---|---|
| 3,838,238 | 11/1974 | Rizzi et al. | 365/105 |
| 4,314,359 | 2/1982 | Kato et al. | 365/179 |
| 4,376,983 | 3/1983 | Tsaur et al. | 365/53 |
| 4,516,223 | 5/1985 | Erickson | 365/175 |
| 4,569,121 | 1/1986 | Lim et al. | 29/574 |
| 4,598,386 | 7/1986 | Roesner et al. | 365/105 |
| 4,604,639 | 8/1986 | Kinoshita | 357/23.6 |
| 4,608,672 | 8/1986 | Roberts et al. | 365/230 |
| 4,635,085 | 1/1987 | Taguchi | 357/23.6 |

OTHER PUBLICATIONS

"Read-Only Memories," *Microelectornic Circuits*, Sedra and Smith, pp. 773-775, 1982.

*Primary Examiner*—Joseph A. Popek
*Attorney, Agent, or Firm*—W. T. Udseth

[57] ABSTRACT

A monolithic integrated circuit memory control operating through the use of MOS field-effect transistors with diode or bipolar circuit arrangement for the bit line column switching.

25 Claims, 3 Drawing Sheets

READ-ONLY MEMORY

The Government has rights in this invention pursuant to Contract No. F29601-85-C-0013, awarded by the Department of the Air Force.

BACKGROUND OF THE INVENTION

The present invention relates to fixed information content memories often referred to as read-only memories (ROM) and, more particularly, to such memories which are subject to charge generating disturbances.

The structural features occurring in monolithic integrated circuit chips have been shrinking in size rapidly in recent years. With such shrinkage in feature sizes, electrical currents and electrical charge accumulations formed and manipulated in such integrated circuits have had to also diminish in value. In these circumstances, charge accumulation quantities generated by certain charge generating disturbances, which in integrated circuits with larger feature sizes would not be a problem, now become quantities that are sufficiently large to cause difficulties in integrated circuits with these smaller features.

Memory circuits typically operate by having a plurality of memory cells each of which is in one state or another as reflected in having some output at one or the other of two logic voltage levels. If these circuits are constructed using the smaller integrated circuit features currently available, the disturbance charges referred to can be sufficient to cause switching from an existing logic level to the opposite at points in the circuit where such charge is generated. Any such switching could lead to improper operation of the circuit resulting in erroneous logic signals from memory cells.

Typically, such disturbances are local to the region where the disturbance is generated and are temporary; thus, such a disturbance is often termed a "single event upset." Also, though the disturbance cause may be temporary, results of the disturbance may be stored and are subject to being propagated further in the system which may lead to a longer term and more significant effect.

A typical source of such charge generating disturbances is particle radiation. Such particles impinging on a monolithic integrated circuit will have "interactions" with the semiconductor material lattice structure and with electrons along its path through the integrated circuit semiconductor material. These interactions will result in raising the energy of the electrons involved into the conduction band and leave corresponding holes in the valence band. Should such electron-hole pairs be generated sufficiently close to a semiconductor pn junction, the electrons and holes so situated are subject to being collected by the action of electric fields in the region resulting because of voltage applied to such junction and because of diffusion toward such junction.

More wide spread charge disturbances which can occur over significant periods of time are termed "global ionization radiation" and may be caused by powerful electromagnetic radiation sources such as x-rays. Such global ionizing radiation will also generate electron-hole pairs which can also be collected by the action of electric fields in the region near a pn junction. The structure of transistor devices in monolithic integrated circuits, and the method of operating both such devices and the circuits using them generally, is such that only reverse-biased pn junctions need to be considered in determining the effects of such particle and electromagnetic wave radiation. For present purposes, these radiations can be considered as generating electron-hole pairs which lead to induced currents in the reverse current direction across affected pn junctions.

In the typical ROM memory circuit constructed of metal-oxide-semiconductor field-effect transistors (MOSFET's) there are four common device combination choices available in selecting and arranging these kinds of transistors to construct the circuit. The first of these is to use all p-channel transistor in a bit line column as word line controlled switching transistors with a p-channel transistor having its source connected to a positive voltage as a load or precharge transistor. Thus, there will be p-channel transistor sources connected to ground and drains connected to the bit line column which will be separated by reverse-biased pn junctions from the substrate. This construction in the presence of significant radiation will lead to a radiation induced current situation which can be modeled by providing a current generator in the memory circuit representing the generation of all these induced junction currents in total. This generator is connected between the substrate and the bit line column directed toward providing current to the bit line column. Thus, radiation will lead to currents which attempt to charge the bit line column. In substantial radiation situations, such currents could provide charge in such large quantities that the column p-channel switching transistors would be unable to sink sufficient current to cause the bit line column to drop in voltage toward ground potential upon a command on a word line connected to the gate of a column p-channel transistor to signify a change in state.

A voltage source interconnection variation for this device combination would be to have the load transistor connected to ground rather than to a positive voltage, and to have the controlled transistors connected to a positive voltage rather than ground. The bit line will be recharged to a low voltage level. The radiation induced current generator, with current directed to still flow into the bit line, again attempts to charge this line. If sufficient current on this line flows, the load transistor will be unable to set the bit line at a low voltage level with the result that voltage thereon will rise even though no word line command has switched on a word line controlled transistor.

Another possibility is the use of all n-channel transistors both as switching transistors connected between the column bit line and a positive voltage with the gates thereof driven by word lines, and as the load or precharge transistor for the column bit line which transistor is connected to ground. In this arrangement, radiation induced currents across the source and drain junctions can again be modeled by having a current generator connected between the bit line column and the substrate directing current into this substrate. Such a generator will have a current flow directed to always attempt to discharge the bit line column to lower the voltage thereon. This discharging by the current generator representing radiation induced currents can be sufficient to prevent the bit line column switching transistors under the command of a word line from being capable of raising the voltage on the bit line column to signify a state change.

A similar voltage source interconnection variation for this device combination is possible here also by instead connecting the lead transistor to a positive voltage and the word line controlled transistors to ground. The radiation induced generator in sinking current from the bit line in sufficient quantities could prevent the lead transistor from raising the voltage on the bit line to precharge it.

The remaining two device combination possibilities commonly encountered depend on complementary symmetry MOSFET's, i.e. CMOS, circuitry where the switching transistors along a bit line column are either all p-channel or n-channel transistors with the opposite transistor type serving as the load or precharge transistor. The results in these circuits are quite similar to the all p-channel and n-channel transistor cases described above. That is, the circuits can be modeled by having a current generator representing the total of the radiation induced currents connected between the bit line column and the substrate. Such generators always provide currents in a direction which lead to the switching transistors connected to the bit line column being unable to drive the voltage on the bit line column to the level desired upon command signals being provided on the word lines connected to the switching transistor gates. The desired level may be either a higher or low level depending on the voltage supply interconnections and the selected device combination.

The situation will be somewhat better in such CMOS circuitry, however, than in that circuitry described in the foregoing with just one kind of MOSFET. This is because the switching transistors, being just one kind of MOSFET, can be contained in an isolating region to electrically isolate them from transistors of the other type. Such a structure reduces the amount of charge collected at the junctions separating these transistor drains from the isolating region because about half the charge generated will be swept across the reverse-biased isolating region substrate pn junction. Thus, lesser valued current generators can be used between the bit line column and the isolating region to represent the radiation induced currents. Nevertheless, this arrangement can have other difficulties such as slow switching.

Thus, there is a need for a ROM memory structure which will be less subject to improper operation in an environment of particle or electromagnetic wave radiation. Such a structure should also permit rapid switching of the switching devices connected to the bit line columns therein, and be compatible with a sensing arrangement also constructed to avoid improper operation of the memory in this kind of an environment.

SUMMARY OF THE INVENTION

The present invention provides a monolithic integrated circuit memory having a plurality of memory point regions formed in a plurality of isolating regions each electrically connected to a first circuit selection means. Pluralities of memory point regions, each such plurality having no more than one selected memory point region from those in each of these isolation regions, are each electrically connected to a second circuit selection means and to a load means. The memory point regions in the isolating regions can be arranged to provide bipolar transistor action to further improve circuit operation. The structure results in diode or bipolar transistor circuit arrangements for the bit line column switching means controlled by the first circuit selection means, and with the second circuit selection means selecting the bit line column. A sense means can be selectively connected to the bit line columns by the second circuit selection means, with this sense means arranged to avoid significantly increasing the risk of upsetting bit line column information in radiation situations. The first circuit selection means, second circuit selection means and a sense means are implemented using MOSFET's.

DETAILED DESCRIPTION OF THE PREFERRED EMBODIMENTS

Rather than using MOSFET's as the bit line column switches in a ROM, an array of diodes or bipolar junction transistors can be used to provide a ROM less subject to improper operation due to single event upsets or global ionizing radiation. Such a memory system is shown in a circuit schematic diagram in FIG. 1 as part of a digital system.

Figure 1:
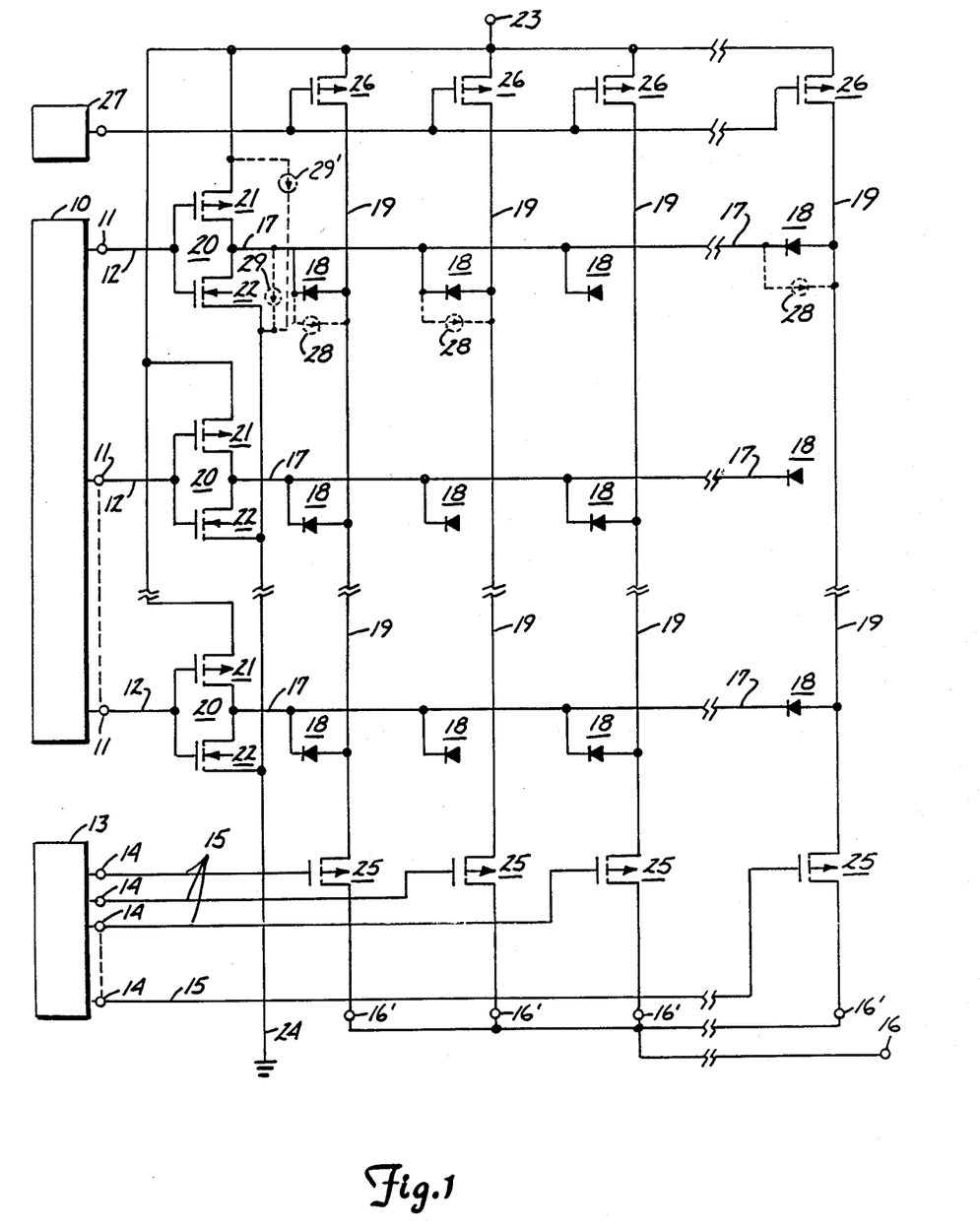
FIG. 1 shows a schematic circuit diagram of the present invention.

A first circuit selection means, 10, is shown in which decoded signals from the digital system addressing circuitry are provided at first selection circuitry outputs, 11, controlling inputs, 12, to inverters for operating word lines. Since only a fraction of the ROM word lines and bit lines for the diode array are shown in FIG. 1 (as indicated by breaks in these lines), many of the outputs from selection means 10 are omitted as is indicated by the dashed line between two outputs 11. Similarly, a second circuit selection means, 13, provides decoded signals from the digital system addressing circuitry at outputs, 14, for controlling inputs, 15, to signal pass switches connected in series between bit lines and the ROM output, 16.

Word lines, 17, shown as horizontal or row electrical interconnections in FIG. 1, are connected by diodes, 18, to bit lines, 19, shown as vertical electrical or columnar interconnections in FIG. 1. However, only certain of word lines 17 are shown connected to any one of bit lines 19 because certain of the anode electrical interconnections of diodes 18 adjacent to that bit line are not completed to that bit line. In this manner, the information to be contained in the memory circuit of FIG. 1 is fixedly stored therein. The presence or absence of an anode interconnection to bit lines 19 to complete interconnecting a word line 17 thereto through the corresponding diode 18 can be defined as either a "0" or a "1". This interconnection presence or absence will be reflected by the presence or absence of voltage level changes at ROM output 16. Such voltage changes, or lack thereof, indicate whether a connection was present to that bit line 19 selected by second circuit selection means 13 from that selected word line 17 being activated by circuit selection means 10 in a determination of the information content of the intersection of these lines.

A word line 17 is selected by a decoded signal appearing at its corresponding output 11 of selection means 10 and so on input line 12 to that inverter, 20, to which that particular word line 17 is connected. Each such inverter serves as a line 17 "driver" in switching that line between logic levels, and comprises a p-channel MOSFET, 21, having its terminating region serving as the drain connected to the terminating region serving as the drain of an n-channel MOSFET, 22. The terminating region serving as the source of each transistor 21 is connected to a terminal means, 23, adapted for connection to a source of positive voltage. The terminating region serving as the source of each of transistors 22 is connected to a ground voltage reference terminal, 24, adapted for connection to a ground reference source of voltage. Each input line 12 goes to the gates of each of transistors 21 and 22 in that inverter 20 corresponding thereto.

Selection of a column line 19 is given effect by a signal appearing at an output 14 of circuit selection means 13 carried by a gate interconnection 15 to the gate of the corresponding one of pass switch p-channel MOSFET transistors, 25. Each of transistors 25 has its terminating region serving as the source connected to the lower end of a bit line column 19 and its terminating region serving as the drain connected to ROM outputs 16. Alternatively, the drain of each of transistors 25 could serve as a single one of a multiplicity of outputs, marked 16' in FIG. 1, if the results on all of the bit line columns 19 were to be provided simultaneously for each selection and activation of a given word line 17.

If synchronous operation is chosen for the ROM of FIG. 1, determination of information content in a location or locations in the ROM occurs at times synchronized with operations of the remainder of the digital system. This is reflected in the timing of the previous signals by first and second circuit selection means 10 and 13. For each such determination in synchronous operation, columns 19, which have parasitic capacitances associated therewith, must be charged to approximately the voltage present at terminal 23. This occurs through the switching into the "on" condition of "precharge" p-channel transistors, 26. The source of each of transistors 26 is electrically connected to terminal 23 and the drains of each of transistors 26 are electrically connected to bit line columns 19. The gates of each of transistor 26 are connected to a precharging control means, 27. In asynchronous operation, the gates of transistors 26 are each connected to a fixed voltage level, or to the drain of that transistor, or to some switching signal which causes transistors 26 to become a load of a substantial impedance. Also for asynchronous operation, transistors 26 could be replaced with other kinds of impedances such as resistors.

In synchronous operation, a signal from control means 27 switches each of transistors 26 momentarily into the "on" condition thereby charging the parasitic capacitances along each column bit line 19. Thereafter, on the basis of address signals generated in circuit selection means 10 and 13, one of outputs 11 of means 10 provides a decoded signal to its corresponding inverter 20 at the input 12 of that inverter. That inverter, prior to this signal, has its n-channel transistor 22 in the "off" condition and its p-channel transistor 21 in the "on" condition. This is also true of the other inverters which remain in this condition even after the provision of a decoded signal. This situation leads to those of diodes 18 connected to bit line columns 19 either having no voltage thereacross or being in a slightly reverse biased condition.

Upon the decoded signal occurring on input 12 of the selected inverter 20, the transistors in that inverter reverse conditions with the corresponding transistor 22 going to the "on" condition and the corresponding transistor 21 going to the "off" condition. This reverse changes the corresponding word line 17 from being near the voltage on terminal 23 to being near the voltage on terminal 24 and leads to each of diodes 18 connected to a bit line column 19 being in the forward-biased condition. Such a condition permits diodes 18 to discharge the corresponding bit line column 19 to which it is connected. Of course, those diodes 18 which are not connected to a bit line column 19 will not discharge that bit line leaving that column 19 at the voltage to which it was earlier charged by its corresponding precharge transistor 26.

The digital system addressing signal, in selecting one of word lines 17 through selection means 10, also causes selection means 13 to select one of pass transistors 25 to be switched into the "on" condition to thereby connect a selected bit line column 19 to output 16. Thus, output 16 will then have a voltage near that occurring on terminal 23 if there was no connection of a diode 18 between the selected bit line column 19 and the selected word line 17. On the other hand, if there were such a connection, a voltage near that occurring on terminal 24 plus the forward voltage drop across that diode 18 making the connection will appear on ROM output 16. Of course, if the drains of each of transistors 25 are to serve as outputs 16', the conditions on each of bit lines 19 will be provided at those outputs through each of transistors 25 being switched into the "on" condition.

Those bit line columns 19 which remain in a high voltage level state after the selection and activation of one of word lines 17, as a result of there being no diode 18 connected between that selected word line and the bit line columns in the high voltage state, will tend to remain in that state. This follows because nothing in the circuit of FIG. 1 acts by itself to discharge such bit line columns. The other word lines 17 which were not selected and which are connected to those high voltage state bit line columns 19 through diodes 18 will tend to continue keeping such bit lines in the high voltage state. This occurs because the leakage through such diodes will tend to charge those bit lines. Thus, in the absence of radiation induced effects leading to improper operation, the states occurring in the ROM as part of an information content determination operation initiated to obtain such information therefrom will tend to remain indefinitely.

Radiation can, as indicated above, have charge generating effects in a semiconductor body of a monolithic integrated circuit chip. These charges, in being collected at reverse-biased pn junctions, can be described and modeled by current generators for generating equivalent currents in a direction which is the same direction that leakage currents flow across the corresponding reverse-biased pn junctions in the ROM circuit.

Some of these modeling current generators have been shown in FIG. 1 to provide an indication of where they are given effect in that circuit. The first kind of such generators are those which represent radiation induced current in the direction of leakage currents across the pn junction forming diodes 18, these current generators being shown in dashed lines and designated by the number 28. Only those current generators present for the first horizontal row of diodes 18 are shown, but they would be present for all of the diodes 18 in the circuit of FIG. 1. No such generator has been shown for those diodes 18 which are not connected to a column line 19 since there cannot be any leakage then to such a bit line column.

The pn junction forming a diode 18 is itself isolated in an isolating region which accomplishes such isolation by reverse-biasing the pn junction occurring between the isolating region and the remaining portion of the semiconductor substrate. This reverse bias junction must also have a current generator representing radiation induced currents associated therewith, and is shown in FIG. 1 as a dashed line current generator connected between a word line 17 and ground reference terminal 24 with the designation 29. Such a current generator will occur for each of word lines 17 but only the generator for the uppermost such word line 17 has been shown in FIG. 1.

Finally, two further current generators are shown for the word line "driving" inverters. A further dashed line current generator, 29', is shown for the reverse biased junction about the isolating region isolating p-channel transistor 21 from remaining portions of the semiconductor substrate. Generator 29' is shown connected to the source of a transistor 21 since the source is shorted to the isolating region in the circuit. Another dashed line current generator, 29", is shown for the reverse biased junction about the drain of p-channel transistor 21 isolating it from the isolation region. Again, generator 29" is shown connected to the source of transistor 21 because of its being directly connected to the isolating region.

Figure 2A:
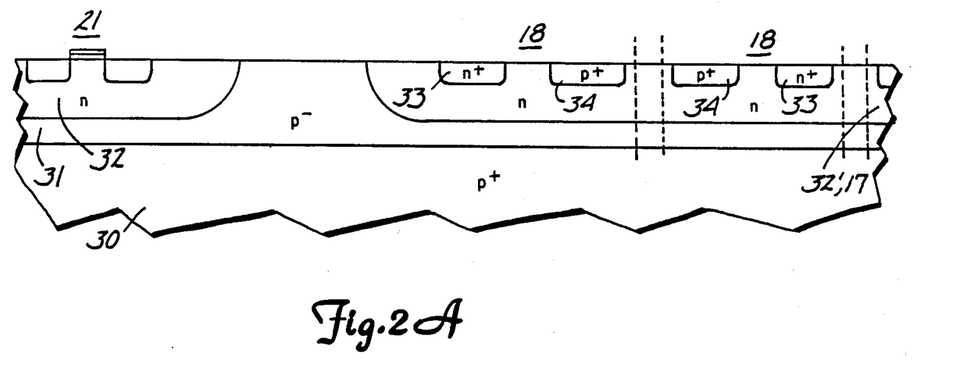
FIGS. 2A and 2B show portions of a monolithic integrated circuit embodiment of the present invention.
Figure 2B:
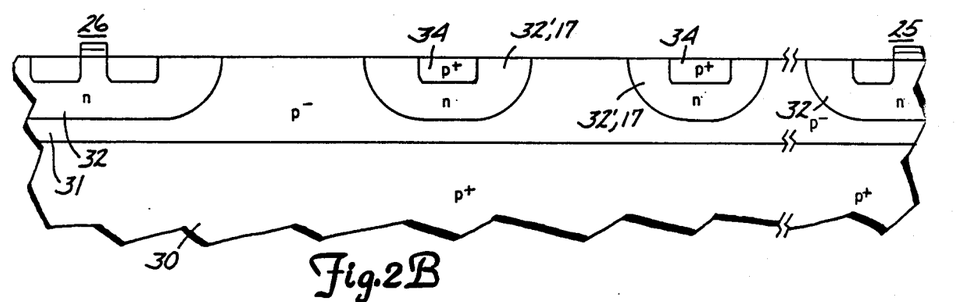

The pn junctions that are the basis for generators designated 28, 29 and 29' can be seen in the cross section views of FIGS. 2A and 2B showing portions of the monolithic integrated circuit chip in which the circuit of FIG. 1 is implemented. A portion of the semiconductor material substrate, 30, is shown being relatively heavily doped to have a relatively high $p^+$-type conductivity. Formed on substrate 30 is a p-type conductivity epitaxial layer, 31, which is relatively much less doped and so of a higher resistivity than is substrate 30. Note that in FIG. 2B, a portion of the monolithic integrated circuit even beyond those portions excluded by the outline in FIGS. 2A and 2B is also omitted, as can be seen by the broken lines occurring there. Also note that all interconnections and insulating structures associated therewith have been omitted in these figures for clarity.

A number of n-type conductivity isolating regions, 32 and 32', are also shown in FIGS. 2A and 2B. Each of these isolating regions is used to electrically isolate p-type conductivity structures from epitaxial layer 31 on substrate 30, either permanently or temporarily. The ones designated 32 are fixedly connected to the highest positive voltage in the circuit to provide a continuous reversed-biased junction isolation because substrate 30 will be connected to the ground reference voltage level. Isolating regions 32' serve as word lines 17 and so are shown with the designation 32', 17. These isolating regions, as word lines 17, are connected to the output of inverters 20 as previously indicated in FIG. 1.

FIG. 2A shows one of p-channel transistors 21 from an inverter 20 in an isolating region 32 which would have the drain thereof electrically connected to region 32',17 of FIG. 2A. However, as indicated above, the electrical interconnection structure has been omitted in FIGS. 2A and 2B. The connection from the drain of transistor 21 would be made to isolating region 32',17 through $n^+$-conductivity regions, 33, provided every so often along the row-like isolating structures used as word lines designated 32',17. Two of these regions 33 are shown in FIG. 2A. Alternatively, a single, continuous $n^+$-conductivity stripe could be provided along a side of the row-like isolating region for such a connection, or other suitable geometrical configurations.

However, these interconnection arrangement may not necessarily be used directly but instead isolating region 32',17 in FIG. 2A may be broken up between the vertical dashed line shown there. Such a division of region 32',17 into a row of separated regions can be accomplished by having $p^-$-conductivity material in epitaxial layer 31 occurring between those dashed lines. This would provide further individual isolating regions 32',17 in a row each containing a region 33 and a further region, 34, of $p^+$-conductivity. Since a word line 17 must be electrically interconnected, even if not a contiguous row of n-type conductivity semiconductor material, a row of regions for a word line 17 can be electrically interconnected using the metallization interconnection system not shown.

Regions 34 of $p^+$-type conductivity serve as the anodes of diodes 18 while regions 32',17, whether a contiguous body for each word line 17 or interconnected separate portions, serve as the cathodes of these diodes in addition to serving as word lines 17. In effect, each word line 17 is a common cathode for the plurality of diodes from the array of diodes 18 formed therealong, these cathodes made common by a contiguous body or by connection through the metallization interconnection system. As will be shown below, the use of diodes 18 as the interconnection element interconnecting word lines 17 and bit lines 19 where desired is advantageous because the breakover nature of a diode current-voltage characteristic in a forward direction limits the voltage drop thereacross even for large current increases.

FIG. 2A is a cross section view of an integrated circuit chip embodying the circuit of FIG. 1 taken along an isolating region 32',17 serving as a single word line 17. FIG. 2B is a cross section view of the same chip taken in a transverse direction along an electrical interconnection from the metallization interconnection network serving as a bit line column 19 across the rows of isolating regions 32',17 which electrically interconnects the anodes of a plurality of diodes from diode array 18. Thus, there can also be seen in FIG. 2B a cross section view of an isolating region 32 containing a "precharge" p-channel transistor 26, and a p-channel pass transistor 25 also formed in an isolating region 32.

The junctions giving rise to current generators 28 are those occurring between regions 34 and isolating regions 32',17. The junctions giving rise to generators 29 are those occurring between regions 32',17 and epitaxial layer 31 coupled with substrate 30. Transistors 21, 25 and 26 are all p-channel MOSFET's each formed in a corresponding isolating region 32, and the junction between region 32 and epitaxial layer 31 provides current generators 29'. The junction between isolating region 32 and the terminating region of transistor 21 serving as its drain provides current generators 29".

As indicated above, the junctions about the reverse-biased source and drains of each of these transistors formed in its corresponding isolating regions 32 collect a significantly lesser amount of radiation induced charges because of being so located. The presence of an isolating region 32 about each such transistor as indicated above, leads to the collection of some of the induced charge which is swept across the junction separating isolating regions 32 and epitaxial layer 31, charge which would otherwise be collected in the sources and drains of these transistors. Thus, these transistors, even though directly connected to the word lines 17 and bit line columns 19, have a reduced likelihood of causing radiation based malfunctions improperly changing the voltage states of these lines. Further, the current value of generator 29' will be much smaller than that of generator 29 because it represents effects of a junction having a much smaller area. Generator 29' would have no effect in any event, as its currents flow just through the power supply for the circuit.

Returning to FIG. 1, generators 28 will provide radiation induced currents to the bit line columns 19 just as leakage does across the junctions of diodes 18. As earlier indicated, these currents can only serve to charge the parasitic capacitances associated with bit line columns 19 to aid in maintaining a high voltage state thereon. However, as one of word lines 17 is brought to a low voltage state by inverter 20 due to that word line being selected by the addressing circuitry in selection means 10, all of the currents flowing in those bit line columns 19 having a connection through a diode 18 to that selected word line will be supplied to that word line. If these current components have large radiation induced current components therein, the selected word line can be brought to, and remain in, a low voltage condition only if the transistor 22 in its corresponding inverter 20 will pass such currents to ground reference terminal 24 without there being a significant voltage drop across that transistor.

Thus, transistors 22 in each inverter 20 must be chosen with a sufficient width-to-length ratio to be certain to accommodate the maximum expected current therethrough. This current will be supplied from all the junction leakages and all of generators 28 occurring between any others of word lines 17 and those bit line columns 19 to which a selected word line 17 is connected. The corresponding inverter 20 which must bring the selected word line 17 to a low voltage state, and hold it there, must have its transistor 22 designed accordingly. Currents induced by radiation are normally expected to be small enough so as not to have a significant effect on word line voltages.

Generators 29 will act to shunt current away from word lines 17 for those word lines 17 placed in a high voltage state by corresponding ones of inverters 20. Thus, transistors 21 in each of inverters 20 must be capable of supplying the current which will be drawn by each generator 29 connected between its corresponding word line 17 and ground reference terminal 24. Consequently, the width-to-length ratio of transistors 21 must be chosen so they are able to provide sufficient current to supply that which is drawn by generators 29 in a radiation circumstance so that word lines 17 are not brought to a lower voltage state than desired because of voltage drops occurring across transistors 21.

Inverters 20, specifically transistors 22, can be aided in discharging currents in bit lines 17 provided by generators 28 in a radiation situation by properly arranging the structures shown in FIGS. 2A and 2B. Note that a pnp material sequence occurs in FIGS. 2A and 2B beginning with region 34 as a p region, regions 32',17 as an n region, and epitaxial layer 31 and substrate 30 as another p region. Thus, the possibility exists of operating these groups of regions together as pnp bipolar junction transistors along a selected word line 17. These pnp transistors shunt to ground through substrate 30 both leakage currents and those currents induced by radiation to flow across the emitter-base junctions of transistors in other unselected word lines 17. Such currents would otherwise flow in a selected word line to ground through the transistor 22 in that inverter 20 to which the selected word line 17 is connected. In addition, these bipolar transistors substantially reduce the time delay needed to sufficiently discharge bit line 19 parasitic capacitances when a selected word line acts to cause a discharge of that bit line through the base-emitter junction connecting them, and through the corresponding transistor collector, rather than just through a diode connection therebetween.

Achieving substantial transistor action in these regions to thereby provide effective pnp bipolar transistors requires that the space between regions 34 and epitaxial layer 31 be sufficiently narrow so that n-type conductivity isolating region 32',17 can serve as a base for the transistor. Therefore, the fabrication process for the integrated circuit chip of FIGS. 2A and 2B must yield regions 32',17 sufficiently narrow after provisions of regions 34 therein for pnp bipolar junction transistors to result. (The spacing between regions 33 and epitaxial layer 31 are irrelevant for these purposes.)

Figure 3:
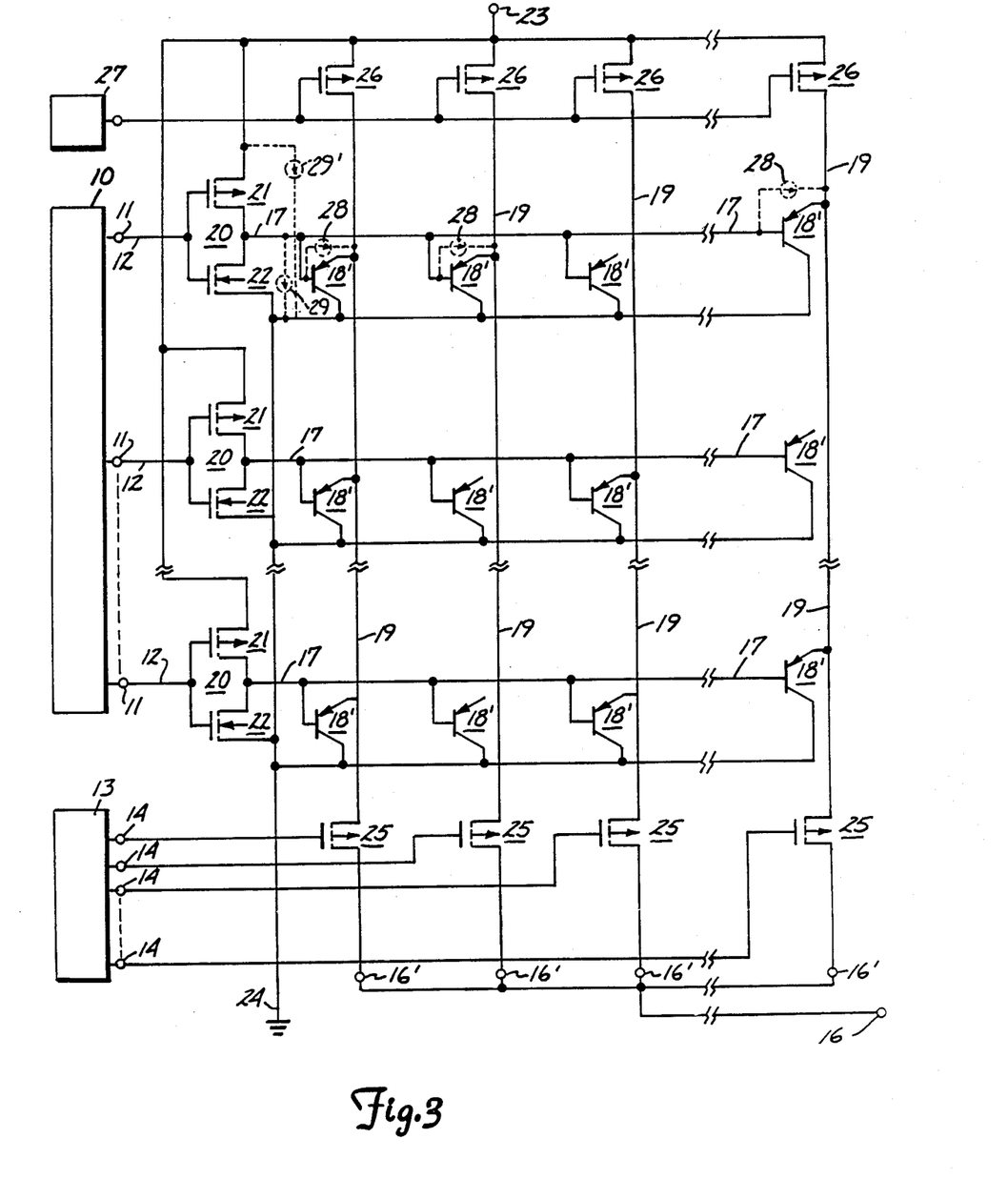
FIG. 3 shows an alternative circuit schematic diagram of the present invention.

If such dimensions are provided for the thickness of isolating regions 32',17 between regions 34 and epitaxial layer 31, the circuit schematic of FIG. 1 becomes the circuit schematic shown in FIG. 3. There, diodes 18 are shown replaced by pnp bipolar junction transistors designated 18'. Operation of the circuit of FIG. 3 is just that of the circuit of FIG. 1 except for the additional current flow locations in substrate 30 to ground because of the transistors 18'. Selecting a word line 17 reduces the voltage level on the base of the pnp transistors 18' provided along that word line to switch them into the "on" condition.

In addition to having transistors 25 and 26 in isolating regions to reduce chances of upsetting a high voltage state occurring on a bit line column 19, any bit line column voltage state sensing means used must not contribute to increasing the risk of upsetting a column line in the presence of radiation. Such a sensing means could be provided at output 16 for connection to one of column lines 19 through its selection by selection means 13 switching to the "on" state the corresponding pass transistor 25, or a plurality of sensing means could be provided at each of column line outputs 16' if that configuration is chosen instead.

If one of, or each of a plurality of, column lines 19 is connected to a sensing means input which is connected in turn only to gates of MOSFET's, there will be no significant increase in such upset risk. The risk would be greatest if, instead, an n-type conductivity region were connected to the sensing means input receiving such a bit line column. This kind of region would typically be a source or drain of an n-channel MOSFET. In this instance, the risk would be significantly reduced if the sensing means input were to be connected through a sufficiently sized impedance to such n n-type conductivity region. Such an impedance would attenuate current transients due to radiation impingement on this region so long s there is means to recharge the bit line after the radiation impingement event.

Figure 4:
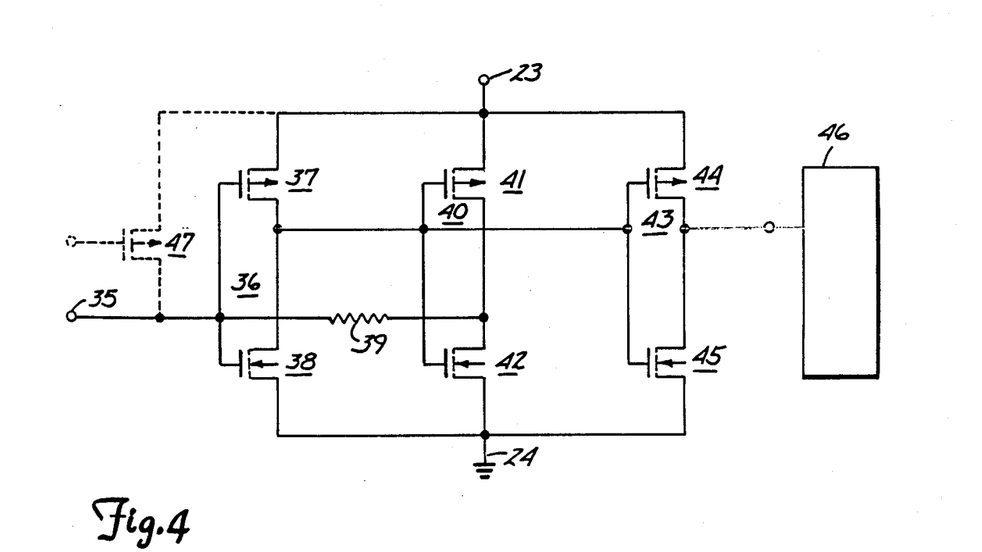
FIG. 4 shows a circuit schematic diagram of an additional aspect of the present invention.

However, there is the further possibility of the sensing means actually enhancing the ability of a bit line column 19 to retain a high voltage state through such a sensing means being connected to either output 16 or to an output 16' supporting that state. Such an arrangement is shown in FIG. 4 where an input, 35, is the point of connection to one of the ROM outputs 16 or 16'. This input is electrically connected to the gates of transistors in a first inverter, 36, comprising a p-channel MOSFET, 37, having its drain electrically connected to the drain of an n-channel MOSFET, 38. The source of p-channel MOSFET 37 is electrically connected to positive voltage supply terminal 23 extended from the ROM structures in the previous figures and the source of transistor 38 is electrically connected to ground reference terminal 24 extended from the ROM structure.

A resistive means, 39, is also connected to input 35 and to the output of a further inverter, 40. The output of inverter 36 at the drains of transistors 37 and 38 is connected to the input of inverter 40 at the gates of the transistors forming inverter 40. These are a p-channel MOSFET, 41, having its drain connected to the drain of an n-channel MOSFET, 42, to form the output of inverter 40. The source of p-channel MOSFET 41 is electrically connected to positive voltage supply terminal 23 and the source of n-channel MOSFET 42 is electrically connected to ground reference terminal 24.

Inverters 36 and 40 of FIG. 4 together form a "feedback latch," the output of which is the output of inverter 36 which is electrically connected to a further inverter, 43. Inverter 43 comprises a p-channel MOSFET, 44, having its drain electrically connected to the drain of an n-channel MOSFET, 45. The source of transistor 44 is electrically connected to positive voltage supply terminal 23 and the source of transistor 45 is electrically connected to ground reference terminal 24. Inverter 43 provides some buffering before the signal sensed at input 35 is passed on to an output buffer and information using system arrangement represented in a block, 46.

The feedback latch output signal taken from its output, which is also the output of inverter 36 as earlier indicated, is supplied to the input gates of inverter 40. This in turn provides an output state at the output of inverter 40, the drains of transistors 41 and 42, which is opposite to that at the output of inverter 36. The inverter 40 output state signal is provided back to the input 35 of the sense means system. This voltage state is then also supplied to the gates of transistors 37 and 38 of inverter 36. Hence, the output of inverter 40, being in the same voltage state as is input 35, helps hold input 35 at whatever logic state has been provided thereto.

Thus, if a bit line column 19 is at a high state and connected, through transistor 25 and through an output 16 or 16' and so to input 35 of the circuit of FIG. 4, the output of inverter 36 will be in the low voltage state. This causes the output of inverter 40 to be in the high voltage state thereby supporting the high voltage state occurring on input 35. Resistor 39 is provided so that a radiation charge accumulation on the n+-type conductivity drain region of transistor 42 will not immediately discharge a bit line column 19 connected to input 35 through a corresponding transistor 25.

Further shown in FIG. 4 is a dashed line p-channel MOSFET, 47, which has its source connected to positive voltage supply terminal 23 and its drain connected to input 35. The gate of transistor 47, if used, would be connected to control means 27 to receive the precharge signal received by transistors 26. Thus, when transistors 26 charge bit line columns transistor 47 charges the connection line from the drains of transistors 25 to the gates of inverter 36 to provide the same full high voltage state voltage at input 35 as occurs on bit line columns 19.

The conductivity types of the structures in FIGS. 2A and 2B could be interchanged. If the voltage supplies were also interchanged, the arrangements so changed would operate essentially as described with the transistors being of the opposite polarity types.

Although the present invention has been described with reference to preferred embodiments, workers skilled in the art will recognize that other changes may be made in form and detail without departing from the spirit and scope of the invention.

What is claimed is:

1. A monolithic integrated memory circuit, said memory comprising:

a semiconductor material body of a first conductivity type in at least a first portion thereof, forming a first body portion, except in a plurality of isolating regions in said first body portion which plurality includes multiple pluralities of said isolating regions each of which has those said isolating regions included therein electrically interconnected to one another to form an interconnection plurality thereby forming multiple interconnection pluralities of said isolating regions, said semiconductor material body having a first major surface which is intersected by selected ones of said plurality of isolating regions with each of said isolating regions being of a second conductivity type;

a plurality of memory point regions which comprises multiple first constituent pluralities of said memory point regions with each of said multiple interconnection pluralities of said isolating regions having those said memory point regions of one of said first constituent pluralities located therein, said plurality of memory point regions also comprising multiple second constituent pluralities of said memory point regions with each of said second constituent pluralities having one of those said memory point regions therein located in each one of said multiple interconnection pluralities of said isolating regions, each said memory point regions being of said first conductivity type and intersecting said first major surface but otherwise being surrounded by that said selected isolating region in which that said memory point region is located;

a plurality of first interconnection means with there being one of said first interconnection means electrically connected to each of said multiple interconnection pluralities of said isolating regions, and to a first circuit selection means;

a plurality of second interconnection means each being electrically connected to a terminating region of a field-effect transistor in a second circuit selection means, there being one of said plurality of second interconnection means being provided for each of said second constituent pluralities but with only selected ones of those said memory point regions in a said second constituent plurality thereof being electrically connected to that said second interconnection means corresponding thereto; and a plurality of second interconnection means impedances each having first and second terminating regions between which a selected conductivity is established, said first terminating region of each of said plurality of second interconnection means impedances being electrically connected to a first terminal means adapted for connection to a first source of voltage, said second terminating region of each of said plurality of second interconnection means impedances being electrically connected to a corresponding one of said plurality of second interconnection means.

2. The memory of claim 1 wherein there is one said memory point region from a said corresponding first constituent of memory point regions in each said electrically interconnected selected isolating region in that one of said multiple interconnection pluralities of isolating regions corresponding to that said first constituent plurality.

3. The memory of claim 1 wherein there is more than one said memory point region from a said first constituent plurality of memory point regions in at least one of said electrically interconnected selected isolating regions in that one of said multiple interconnection pluralities of isolating regions corresponding to that said first constituent plurality.

4. The memory wherein each said electrically interconnected selected isolating region in one of said multiple interconnection pluralities of isolating regions is electrically interconnected by a portion of said semiconductor material body of said second conductivity type to thereby form a continuous isolating region.

5. The memory of claim 1 wherein each memory point region is separated by that said selected isolating region in which it is located from remaining parts of said first body portion of said first conductivity type, excluding other said memory point regions, by a distance sufficiently small to permit bipolar transistor action with that selected isolating region serving as a base.

6. The memory of claim 1 wherein each of said plurality of second interconnection impedance means is a transistor means having its first and second terminating regions serving as said terminating regions of said second interconnection impedance means and located in a said selected isolating region as a second interconnection transistor means, each said second interconnection transistor means having a control region therein by which it is capable of being directed, through electrical energization thereof, to effectively provide a conductive path between its first and second terminating regions of a selected conductivity.

7. The memory of claim 6 wherein each of said second interconnection transistor means in said plurality thereof is a field-effect transistor means each having drain and source regions serving as its said terminating regions.

8. The memory of claim 6 wherein there is further provided a plurality of second interconnection control transistors in said second circuit selection means each being a field-effect transistor and having first and second terminating regions therein located in a said selected isolating region and having a gate region therein, each of said second interconnection means being electrically connected to a corresponding one of said second interconnection means control transistor means at its first terminating region.

9. The memory of claim 8 wherein each memory point region is separated by that said selected isolating region in which it is located from remaining parts of said first body portion of said first conductivity type, excluding other said memory point regions, by a distance sufficiently small to permit bipolar transistor action with that selected isolating region serving as a base.

10. The memory of claim 8 wherein a sensing means is electrically connected to said second interconnection control transistor means second terminating region, said sensing means having transistor means therein each having first and second terminating regions therein and having a control region therein by which it is capable of being directed, through electrical energization thereof, to effectively provide a conductive path between its first and second terminating regions of a selected conductivity, said second interconnection control transistor means second terminating region being electrically connected solely to said sensing means transistor means control regions.

11. The memory of claim 10 wherein each memory point region is separated by that said selected isolating region in which it is located from remaining parts of said first body portion of said first conductivity type, excluding other said memory point regions, by a distance sufficiently small to permit bipolar transistor action with that selected isolating region serving as a base.

12. The memory of claim 10 wherein each of said second interconnection transistor means in said plurality thereof in a field-effect transistor means each having drain and source regions serving as its said terminating regions, and each of said sensing means transistor means is a field-effect transistor means each having drain and source regions serving as its said terminating regions.

13. The memory of claim 8 wherein said second interconnection control transistor means second terminating region is electrically connected to a sensing means, said sensing means having therein transistor means having first and second terminating regions located in a said first body portion outside of said selected isolating regions and having a control region therein by which it is capable of being directed, through electrical energization thereof, to effectively provide a conductive path between its first and second terminating regions of a selected conductivity, said second interconnection control transistor means second terminating region being electrically connected to said sensing means transistor means terminating regions solely through a fixed impedance means.

14. The memory of claim 13 wherein each of said second interconnection transistor means in said plurality thereof is a field-effect transistor means each having drain and source regions serving as its said terminating regions, and each of said sensing means transistor means is a field-effect transistor means each having drain and source regions serving as its said terminating regions.

15. The memory of claim 8 wherein said second interconnection control transistor means second terminating region is electrically connected to a sensing means, said sensing means having first and second inverters therein each having an input and an output such that an opposite logic level occurs at an output from that logic level applied to an input, said second interconnection control transistor means second terminating region being electrically connected to said input of said first inverter, said first inverter output being electrically connected to said second inverter input, and said second inverter output being electrically connected through a fixed impedance means to said first inverter input.

16. The memory of claim 15 wherein each of said second interconnection transistor means in said plurality thereof is a field-effect transistor means each having drain and source regions serving as its said terminating regions, and each of said sensing means transistor means is a field-effect transistor means each having drain and source regions serving as its said terminating regions.

17. The memory of claim 8 wherein each second interconnection control transistor is a metal-oxide-semiconductor field-effector transistor (MOSFET).

18. The apparatus of claim 6 wherein each memory point region is separated by that said selected isolating region in which it is located from remaining parts of said first body portion of said first conductivity type, excluding other said memory point regions, by a distance sufficiently small to permit bipolar transistor action with that selected isolating region serving as a base.

19. The memory of claim 1 wherein there is further provided a plurality of first interconnection first control transistor means in said first circuit selection means each having first and second terminating regions therein located in a said selected isolating region and having a control region therein by which it is capable of being directed, through electrical energization thereof, to effectively provide a conductive path between its first and second terminating regions of a selected conductivity with each of said first interconnection means being electrically connected to a corresponding one of said first interconnection first control transistor means at its second terminating region.

20. The memory of claim 19 wherein there is further provided a plurality of first interconnection second control transistor means in said first circuit selection means each having first and second terminating regions therein located in said first body portion and having a control region therein by which it is capable of being directed, through electrical energization thereof, to effectively provide a conductive path between its first and second terminating regions of a selected conductivity with each of said first interconnection means being electrically connected to a corresponding one of said first interconnection second control transistor means at its first terminating region.

21. A memory circuit, said circuit comprising
an array of diodes each having a pair of terminating regions serving as anodes and cathodes thereof, said array of diodes comprising first multiple pluralities of initial terminating region-connected diodes such that an initial one of said pair of terminating regions of those said diodes in any one of said first multiple pluralities are electrically interconnected to one another, and each remaining one of said pair of terminating regions in a said diode, in any one of those said first multiple pluralities, corresponding to one remaining terminating region in a said diode in each of those other ones of said first multiple pluralities to thereby form second multiple pluralities of corresponding diodes;
a first circuit selection means electrically connected to said initial terminating regions in each one of said first multiple pluralities;
a plurality of field-effect transistors each having a pair of terminating regions serving as source and drain thereof and a gate region with there being one said field-effect transistor corresponding to each one of said second multiple pluralities, and with selected ones of said remaining terminating regions of those said diodes in each one of second multiple pluralities being electrically connected to one of said pair of terminating regions of its corresponding said field-effect transistor; and
a second circuit selection means electrically connected to each of those said terminating regions of said plurality of field-effect transistors that are electrically connected to diodes in a corresponding one of said second multiple pluralities as aforesaid.

22. The circuit of claim 21 wherein said initial terminating regions of those said diodes in any one of said first multiple pluralities electrically connected to one another are cathodes of said diodes, and each said remaining terminating region in such a said diode is an anode thereof.

23. The circuit of claim 21 wherein said plurality of field-effect transistors are each a metal-oxide-semiconductor field-effect transistor (MOSFET).

24. A memory circuit, said circuit comprising:
an array of bipolar transistors having collectors thereof electrically interconnected to one another, said array of bipolar transistors comprising first multiple pluralities of base-interconnected bipolar transistors such that bases of those said transistors in any one of those said first multiple pluralities thereof are electrically interconnected to one another, and each bipolar transistor having an emitter such that each emitter in a said bipolar transistor, in any one of those said first multiple pluralities, corresponds to one emitter in a said bipolar transistor in each of those other ones of said first multiple pluralities remaining to thereby form second multiple pluralities of corresponding bipolar transistors;
a first circuit selection means electrically connected to said bases in each one of said first multiple pluralities;
a plurality of field-effect transistors each having a pair of terminating regions serving as sources and drains thereof and a gate region with there being one of said field-effect transistors corresponding to each one of said second multiple pluralities, and with selected ones of said emitters of those said bipolar transistors in each one of said second multiple pluralities being electrically connected to one of said pair of terminating regions of its corresponding said field-effect transistor; and
a second circuit selection means electrically connected to each of those said terminating regions of each of said field-effect transistors that are electrically connected to bipolar transistors in a corresponding one of said second multiple pluralities as aforesaid.

25. The circuit of claim 24 wherein said plurality of field-effect transistors are each a metal-oxide-semiconductor field-effect transistor (MOSFET).

* * * * *

UNITED STATES PATENT AND TRADEMARK OFFICE
CERTIFICATE OF CORRECTION

PATENT NO. : 4,884,238
DATED      : November 28, 1989
INVENTOR(S) : LEE ET AL

It is certified that error appears in the above-identified patent and that said Letters Patent is hereby corrected as shown below:

Column 12, line 59, delete "second"
Column 12, line 59, after "interconnection", insert --impedance--
Column 12, lines 59-60, delete "impedances"
Column 12, line 63, delete "second"
Column 12, line 63, after "interconnection", insert --impedance--
Column 12, line 64, delete "impedances"
Column 12, line 67, delete "second"
Column 12, line 67, after "interconnection", insert --impedance--
Column 12, line 68, delete "impedances"
Column 13, line 17, after "memory", insert --of claim 1--
Column 13, line 31, delete "second"
Column 13, lines 33-34, delete "second"
Column 14, line 15, after "thereof", delete "in", insert --is--
Column 15, line 1, delete "apparatus", insert --memory--

Signed and Sealed this

Eleventh Day of December, 1990

*Attest:*

HARRY F. MANBECK, JR.

*Attesting Officer*         *Commissioner of Patents and Trademarks*